United States Patent [19]

Libretti et al.

[11] Patent Number: 5,353,194
[45] Date of Patent: Oct. 4, 1994

[54] MODULAR POWER CIRCUIT ASSEMBLY

[75] Inventors: Giuseppe Libretti; Paolo Casati, both of Milan, Italy

[73] Assignee: SGS-Thomson Microelectronics s.r.l., Milan, Italy

[21] Appl. No.: 142,723

[22] Filed: Oct. 24, 1993

Related U.S. Application Data

[63] Continuation of Ser. No. 876,778, Apr. 30, 1992, abandoned.

[51] Int. Cl.$^5$ .............................................. H05K 7/20
[52] U.S. Cl. ................... 361/707; 174/52.4; 257/707; 361/736; 361/764
[58] Field of Search .................. 174/52.2, 52.4; 257/706, 707, 709, 713, 717, 732; 165/80.3, 185; 361/689, 690, 704, 707, 709, 711–713, 715, 736, 752, 760, 761, 764, 776

[56] References Cited

U.S. PATENT DOCUMENTS

| | | | |
|---|---|---|---|
| 4,218,724 | 8/1980 | Kaufman | 361/395 |
| 4,807,019 | 2/1989 | Tustaniwskyj | 357/74 |
| 4,924,296 | 5/1990 | Cini | 357/72 |
| 4,999,740 | 3/1991 | Ilarde | 361/386 |
| 5,012,386 | 4/1991 | McShane | 361/386 |
| 5,045,921 | 9/1991 | Lin | 357/74 |
| 5,081,562 | 1/1992 | Adachi | 361/401 |
| 5,124,783 | 6/1992 | Sawaya | 357/81 |
| 5,159,532 | 10/1992 | Kilian | 361/388 |
| 5,222,014 | 6/1993 | Lin | 361/414 |

FOREIGN PATENT DOCUMENTS 0219627 1/1986 European Pat. Off. .

OTHER PUBLICATIONS

Kassotakis G. P., "High Power . . . Technique", Navy Technical Bulletin 11(4): 85–89, Jun. 1986.

*Primary Examiner*—Gerald P. Tolin
*Attorney, Agent, or Firm*—Seed and Berry

[57] ABSTRACT

A modular construction power circuit arrangement is disclosed which comprises a thin metal plate performing holder and heat sink functions, a multiplicity of electronic devices in the form of semiconductor material chips having metalized pads as their terminals, a printed circuit board attached to the thin metal plate, electric conductors between the metalized pads and the printed circuit on the board, terminating connectors which form a part of the printed circuit board for connecting the circuit arrangement to external circuits, and a plastics material body which conglomerates a portion of the thin metal plate, the semiconductor material chips, and the printed circuit board. At least one of the semiconductor material chips is attached directly to the thin metal plate and extends therefrom through an opening in the printed circuit board.

22 Claims, 2 Drawing Sheets

MODULAR POWER CIRCUIT ASSEMBLY

CROSS-REFERENCE TO RELATED APPLICATION

The present application is a continuation of U.S. patent application Ser. No. 07/876,778 filed Apr. 30, 1992, now abandoned.

DESCRIPTION

TECHNICAL FIELD

This invention relates to electronic circuits, and particularly to a modular construction, power circuit arrangement which is by itself capable of performing a specific electronic function with no assistance from external components.

BACKGROUND OF THE INVENTION

Known are circuit arrangements which comprise a printed circuit board, that is a laminate of insulative material and metal whereon metallic paths are formed, as by photolithographic and/or metalization techniques, to create electric interconnection lines, and a plurality of electronic devices and components having respective terminals soldered to the ends of the electric interconnection lines. The printed circuit board has terminals which can be coupled to an electric power supply and to external components and devices in order to have the circuit arrangement serve its designed electronic function.

Modular structures of this kind are used in several applications to both perform signal processing and control functions for electric or electromechanical devices. The latter applications require that such structures be designed to provide effective dissipation of the heat generated in operation by their active and passive electronic components.

The trend toward increased miniaturization of electronic systems dictates modular arrangements of ever more compact design. However, a limitation to compactness of design comes from the sizes of the devices and the components that go into the modular structure and of the heat sinks which must be coupled thereto to dissipate the heat generated by their operation. To circumvent this limitation, besides providing smaller size components, so-called multi-chip structures have been proposed wherein the active electronic components—i.e., basically integrated circuits and power transistors formed on different chip as of a semiconductor material—are assembled within a single package including a thin metal plate which combines the functions of a holder and a heat sink and can be connected to an external heat sink of a larger size, and a metallic conductor arrangement for connecting the chips together and to the outside which is formed from thin sheet metal as by blanking. A structure of this kind is described for instance in U.S. Pat. No. 4,924,296 assigned to this same Applicant.

Such a structure can only be used to advantage where the electric chip interconnections are not too crowded, because of such links being usually formed of thin wires soldered to special metalized pads on the chips which, of course, should not be allowed to contact one another. Thus, it does not lend itself for use with circuits involving a large number of interconnected devices and high power components.

SUMMARY OF THE INVENTION

It is an object of this invention to provide a power circuit arrangement of modular construction which is extremely compact, can provide a high rate of heat dissipation, and can include both active and passive devices and circuit components in large numbers.

This object is achieved, according to the invention, by a power circuit arrangement as defined and characterized in the claims appended hereto.

The invention will be better understood from the following detailed description of an exemplary and in no way limitative embodiment thereof, to be read in conjunction with the accompanying drawings.

DETAILED DESCRIPTION OF THE INVENTION

Figure 1:
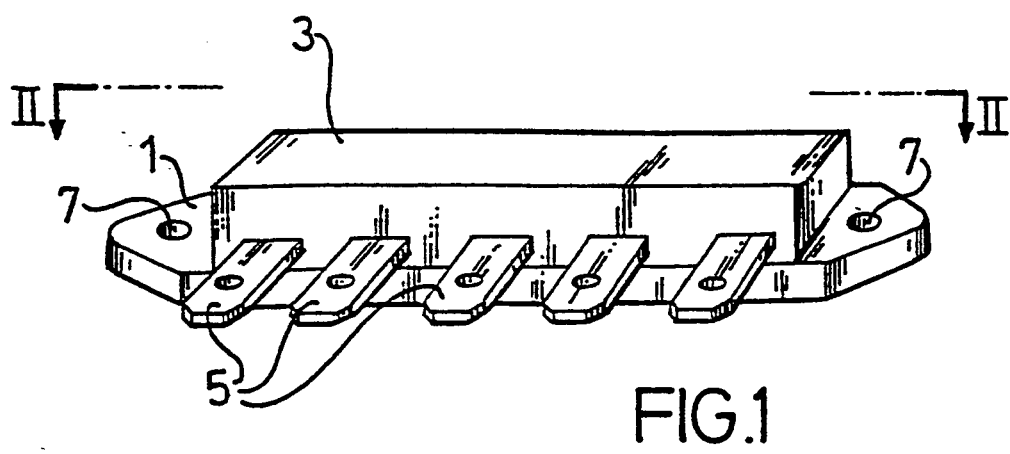
FIG. 1 is a full-size perspective view of a power circuit assembly according to the invention.

With reference to the drawings, there are shown a thin plate 1 of a metal, such as copper, which performs support and heat dissipation functions, a plastic body 3 made of a plastics material such as a thermosetting epoxy resin, which is anchored on the plate 1, and terminating connectors 5 for electrically connecting the circuit assembly to a power supply and electrical or electromechanical devices.

The plate 1 has two clearance holes 7 for attaching the assembly to a large-size heat sink.

The plastic body 3 retains a printed circuit board 9, consisting of, for example, a GRP insulating layer in a manner known per se, and metallic paths 11 and areas 13, respectively, across each of its faces. The paths 11 and areas 13 are interconnected electrically at selected locations through clearance holes 15 formed with metalized wall surfaces.

If required, the board 9 may conventionally comprise two or more overlaid insulating layers, each provided with metallic paths 11 and areas 13 across its faces.

The terminating connectors 5 comprise fully metalized parts of the board 9. In the example shown, these are shaped and sized such that they can be fitted with standard slide connectors of a commonly used type in several industrial applications.

The printed circuit board 9 has two openings 17 and is joined to the thin metal plate 1 with the interposition of a thin layer 19 of an electrically insulative material formed with openings 21 in registry with those through the board 9. Attached to the plate 1 as by soldering, for example, are two chips of a semiconductor material 23, which may be two integrated power circuits and are positioned to register with the openings 17 and 21, thereby they extend from the plate 1 to bring their top surfaces to the same level as the top surface of the printed circuit board 9.

Figure 5:
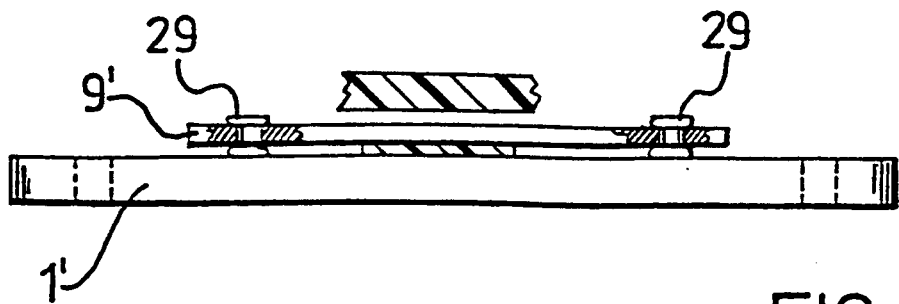
FIG. 5 is a sectional view taken through a modified embodiment of the circuit assembly according to the invention.

According to one embodiment, the thickness of the insulating layer 19 and circuit board 9 are selected to ensure that the thickness of the two together as assembled approximately equal the thickness of the chips 23, so that the top of the chips is approximately level with the top of the circuit board 9. This can be accomplished by varying the thickness of insulating layer 19. In the embodiment of FIG. 5, the posts maintain the PC board a selected distance above the base plate 1 to achieve this result, if desired. Alternatively, the thickness of the circuit board is varied as necessary.

Another semiconductor material chip 25, such as a signal processing IC, microcomputer, processor, or the like is soldered to a metallic area 13 on the board 9.

Thin electric connection wires 27, e.g. made of gold or aluminum, are soldered with their ends between metalized pads of the integrated circuits 23 and 25 and adjacent metallic areas 13 on the board 9.

Additional components, such as resistors and capacitors, not shown in the drawings for clarity, are soldered with their terminals across specially provided metallic areas 13 on the board 9.

The electrical interconnection between the chip 25 and chips 23 permit microprocessor control of the chips 23 within the assembly without the need of a large number of external connections, the connections being on the printed circuit board 9 and contained entirely within the plastic cover 3.

According to one embodiment, the power IC chips 23 are positioned adjacent the external connectors 5 and closer to connectors 5 than the controller IC 25. Having the power IC chips 23 closer shortens the length of the high power electrical path on the circuit board, reducing the losses.

The method of assembling the parts that form the aforesaid modular structure generally comprises the steps of soldering the integrated power circuits 23 to the thin plate 1, cementing the insulating layer 19 onto the plate 1 and the printed circuit board 9, (to this aim, the insulating layer may have applied preliminarily an adhesive material over both of its faces), soldering the integrated circuit 25 onto its corresponding metallic area 13 of the board 9, soldering the terminals and additional components to their corresponding metallic areas 13, soldering the interconnection leads 27, and forming the plastics body 3 by a conventional technique of injecting an epoxy resin in the liquid state into a suitable mold, followed by curing.

Figure 2:
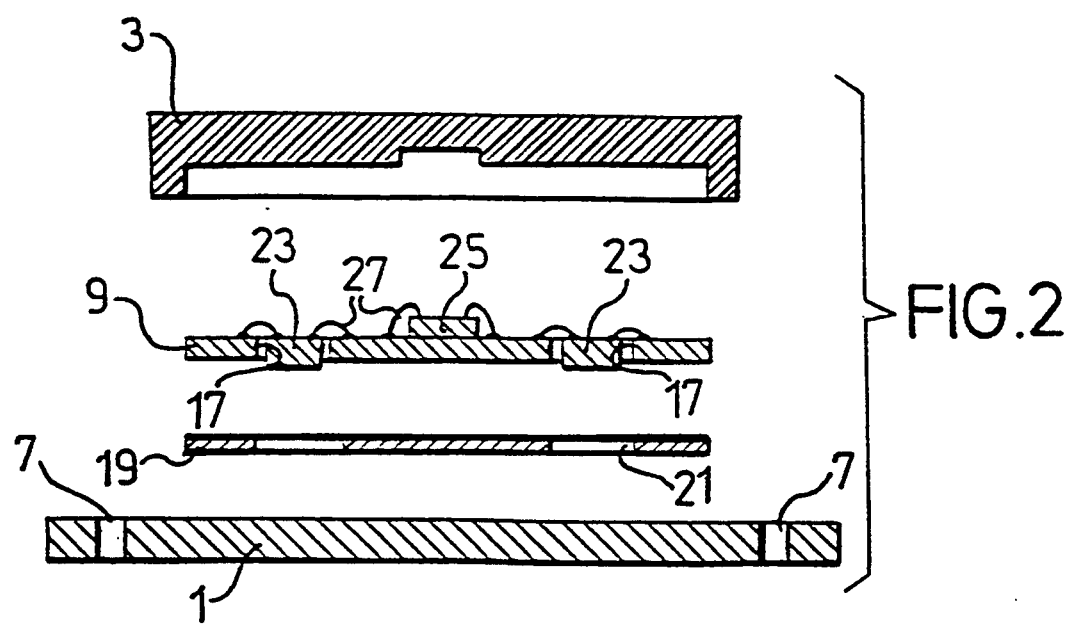
FIG. 2 shows a cross-section taken along the line II—II in FIG. 1, with major parts in exploded view.
Figure 3:
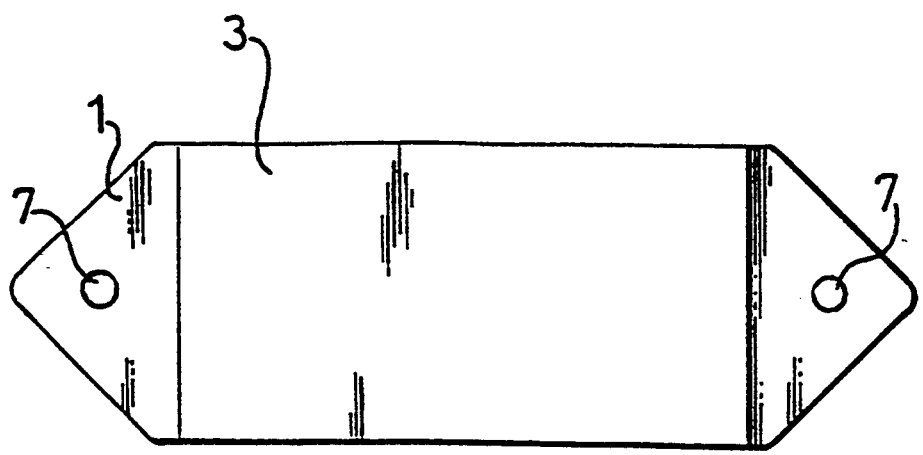
FIG. 3 is a top plan view of the assembly shown in FIG. 1.
Figure 4:
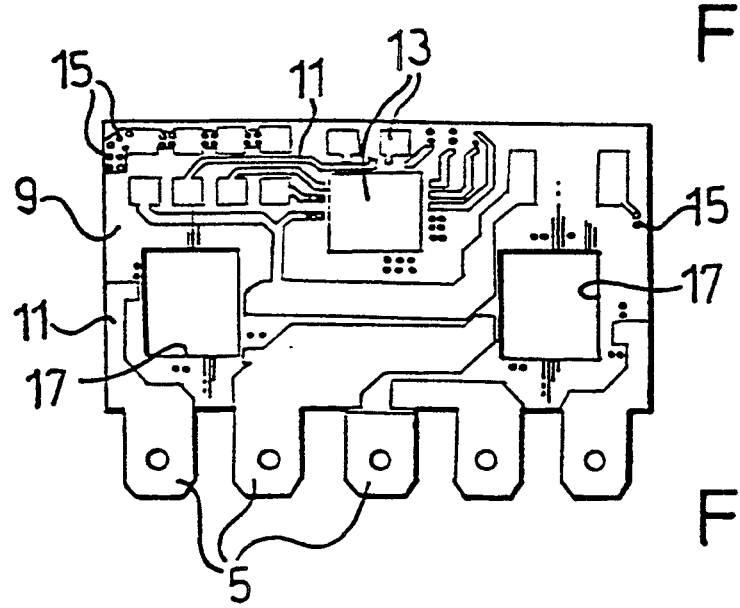
FIG. 4 is a top plan view of a printed circuit board incorporated to the assembly in FIG. 1.

In a modified embodiment of the invention, as shown in FIG. 5, the insulation between the printed circuit board and the thin metal support can be provided by securing on the thin plate, indicated at 1' in the drawings, posts 29 which are shaped such that the board 9'—being formed with clearance holes at the locations of such posts—will come to bear on rest surfaces provided by radially enlarged portions of the posts. The post heads are pressed flat, such as by heat molding or the like, to secure the board 9' in place. While only two parts 29 are shown in FIG. 5 for simplicity, it is anticipated that many more could be used if desired, with corresponding holes in board 9'. During the molding process, the liquid state epoxy flows into the gap between the board 9' and the plate 1' to form an insulating layer therein which will impart stability and rigidity to the structure. The final structure thus has an insulating layer automatically formed between the board 9' and the heat sink 1' as part of the molding process. Any through board devices, such as 23 shown in FIG. 2, would be surrounded and retained by the plastic molding resin.

It may be appreciated that the circuit arrangement of this invention can be made extremely compact on account of it having no production, and hence bulky, active devices mounted on its interior, and is highly efficient in terms of heat dissipation because of the power chips being in direct contact with the thin metal plate 1 acting as a heat sink, and possibly as a heat conductor where arranged to contact a larger heat sink, and can be used without problems with internal devices and components in large numbers as the electric interconnections are provided by the printed circuit on the board.

It should be noted that, owing to the internal connections being quite short in length, the losses from Joule's Effect due to the high currents involved—which are considerable in conventional structures on account of the significant lengths of their connection lines—are here much attenuated, which reflects in a very favorable energy balance over the prior art. Additionally having the power IC chips 23 adjacent the connectors 5 further shortens this path of high current.

The circuit arrangement could also include active and passive devices and components connected to a metallic areas 13 and paths 11 on the inward, rather than outward, face of the PC board; in that case, they could be set in the board itself or fitted in specially provided openings and joined electrically to the areas or the paths using means other than those described. Alternatively, as further variations, the semiconductor material chips could be cemented, not soldered, and the insulating layer 19, as a separate structural element, could be omitted and the PC board 9 be provided with an insulating layer as its finish bottommost ply.

In a further variation, the PC board 9 may have, as its finish, bottommost ply, a metal layer, and accordingly, be soldered to the thin plate 1, instead of being cemented thereon.

While two embodiments and variations of this invention have been discussed, it is understood that many modifications may be made within the scope of the basic inventive principle.

The invention includes a modular construction power circuit assembly comprising;
a thin metal plate with holder and heat sink functions;
a plurality of electronic devices in the form of semiconductor material chips having metallized pads as terminals thereof,
means of electrical interconnection comprising conductors which are connected to said metallized pads;
terminating connectors for connecting the circuit arrangement to external electric circuits, a plastics material body coupled to the thin metal plate to leave at least a surface portion of one of its faces and the terminating connectors exposed and covering the semiconductor material chips; and
a printed circuit board joined to the thin metal plate, the printed circuit on said board carrying some of the said interconnection means including the terminating connectors, and having at least one of semiconductor material chips attached directly to the thin metal plate extending therefrom through an opening in the printed circuit board.

The invention includes the circuit arrangement as described immediately above, characterized in that the printed circuit board is joined to the thin metal plate by a double-sided adhesive layer.

Alternatively, the invention includes the circuit arrangement described above, characterized in that the printed circuit board is joined to the thin metal plate by rivets being fast with the thin plate and shaped to provide spacers between the board and the plate, and that the plastics body extends in the gap defined between the board and the plate by the spacers.

The invention includes a modular power circuit assembly comprising:
- a metal base plate adapted to be a heat sink;
- a printed circuit board having conductive areas on a surface thereof, said circuit board being attached to said metal base plate;
- a plurality of electrical interconnections formed on said printed circuit board and electrically connected to said conductive areas;
- an aperture extending completely through said printed circuit board to exposed said metal base plate through said circuit board;
- a plurality of semiconductor chips electrically connected to the conductive areas of said printed circuit board, a least one of said semiconductor chips being positioned within said aperture, passing through said circuit board and being attached directly to said metal base plate; and
- a plastic cover extending over said printed circuit board to enclose said semiconductor chips and said conductive areas.

The invention includes the circuit assembly as described immediately above wherein said electrically insulating layer is a integral portion of said plastic cover, the plastic being injected in liquid form between said circuit board and said base plate simultaneously with said plastic cover being formed.

Alternatively, the invention includes the circuit assembly described above wherein said printed circuit board includes an electrically insulating layer as a bottom layer thereof.

We claim:

1. A modular construction power circuit assembly comprising;
   - a thin metal plate with holder and heat sink functions;
   - a plurality of electronic devices having metallized pads as terminals thereof;
   - means of electrical interconnection comprising conductors which are connected to said metallized pads;
   - terminating connectors for connecting the circuit assembly to external electric circuits;
   - a unitary plastics material body enclosing the electronic devices and the electrical interconnection means and coupled to the thin metal plate to leave at least a surface portion of one of its faces and the terminating connectors exposed and covering the electronic devices; and
   - a printed circuit board joined to the thin metal plate, the printed circuit on said board carrying some of the interconnection means including the terminating connectors, and having at least one of the electronic devices attached directly to the thin metal plate extending therefrom through an opening in the printed circuit board;
   - wherein the printed circuit board is joined to the thin metal plate by posts secured to the thin metal plate and the posts providing a gap between the board and the plate, and the plastics body extends in the gap provided between the board and the plate by the posts.

2. The assembly according to claim 1 wherein the gap has a thickness that is selected so that the sum of the thickness of the printed circuit board and the gap thickness equals approximately the thickness of the electronic device that extends through said aperture such that the top surface of said circuit board and the top surface of the electronic device are at approximately the same level.

3. A modular power circuit assembly comprising:
   - a metal base plate adapted to be a heat sink;
   - a substantially rigid printed circuit board having conductive areas on a surface thereof, said circuit board being attached to said metal base plate;
   - a plurality of electrical interconnections formed on said printed circuit board, at least some of which are electrically connected to at least some of said conductive areas;
   - an aperture extending completely through said printed circuit board to expose said metal base plate through said circuit board;
   - a plurality of semiconductor chips electrically connected to the conductive areas of said printed circuit board, a first one of said semiconductor chips being positioned within said aperture, passing through said circuit board and being attached directly to said metal base plate;
   - a unitary plastic cover extending over said printed circuit board to totally enclose said semiconductor chips, said plurality of electrical interconnections, and said conductive areas between the unitary plastic cover and the base plate; and
   - a plurality of electrical connectors integral with and extending from said printed circuit board, said connectors being metallized parts of the printed circuit board, being exposed outside of said plastic cover and being connected to some of said electrical interconnections in a region enclosed by said plastic cover.

4. A circuit arrangement according to claim 3 wherein the printed circuit board is joined to the thin metal plate by a double-sided adhesive layer.

5. The assembly according to claim 3, further including:
   - an electrically insulating layer having a selected thickness positioned between the printed circuit board and said metal base plate.

6. The assembly according to clam 5 wherein said electrically insulating layer is a distinct layer positioned between said circuit board an said base plate, said distinct layer having an aperture therethrough coinciding with the aperture through said printed circuit board.

7. The assembly according to claim 5 wherein said electrically insulating layer is an integral portion of said unitary plastic cover, such that the unitary plastic cover includes the electrically insulating layer.

8. The assembly according to claim 5 wherein said selected thickness is selected so that the sum of the thickness of the printed circuit board and the selected thickness equals approximately the thickness of the semiconductor chip that extends through said aperture such that the top surface of said circuit board and the top surface of said semiconductor chip are at approximately the same level.

9. The assembly according to claim 3 wherein said printed circuit board includes an electrically insulating layer as a bottom layer thereof.

10. The assembly according to claim 3 wherein a first one of said plurality of semiconductor chips is attached directly to the circuit board and further including:

conductive wires extend from bond pads on said first semiconductor chip to said conductive areas on said circuit board to electrically connect integrated circuits on said first semiconductor chip to said circuit board.

11. The assembly according to claim 3, further including:

conductive wires extending from bond pads on said semiconductor chip positioned within said aperture and being connected to said conductive areas on said circuit board to electrically connect integrated circuits on said semiconductor chip extending through said aperture to said circuit board;

said electrical interconnections forming an electrical circuit connection between said first semiconductor chip and a second semiconductor chip mounted on said circuit board to perform electrical circuit functions using both of said chips without having the electrical signals between the chips being provided out of said assembly on said electrical connectors.

12. The assembly according to claim 11 wherein said semiconductor chip extending through said aperture and contacting said base plate is positioned closer to said electrical connectors than the first semiconductor chip which is attached to said circuit board.

13. The assembly according to claim 3, further including:

a plurality of apertures extending through said base plate and exposed outside of said plastic cover for permitting said base plate to be attached to another surface.

14. The assembly according to claim 3 wherein the entire printed circuit board except for the electrical connectors is totally enclosed between the plastic cover and the base plate, the electrical connectors extending through the plastic cover.

15. A modular power circuit assembly comprising:

a metal base plate adapted to be a heat sink;

a printed circuit board having conductive areas on a surface thereof, said circuit board being attached to said metal base plate;

a plurality of electrical interconnections formed on said printed circuit board and electrically connected to said conductive areas;

an aperture extending completely through said printed circuit board to expose said metal base plate through said circuit board;

a plurality of semiconductor chips electrically connected to the conductive areas of said printed circuit board, a first one of said semiconductor chips being positioned within said aperture, passing through said circuit board and being attached directly to said metal base plate; and a unitary plastic cover extending over said printed circuit board to enclose said semiconductor chips and said conductive areas within the unitary plastic cover and the base plate.

a plurality of stand-off posts extending through said circuit board and having enlarged base support areas which support said printed circuit board a selected distance above said base plate.

16. The assembly according to claim 15 wherein said electrically insulating layer is an integral portion of said unitary plastic cover, such that the unitary plastic cover includes the electrically insulating layer.

17. The assembly according to claim 16 wherein said selected thickness is selected so that the sum of the thickness of the printed circuit board and the selected thickness equals approximately the thickness of the semiconductor chip that extends through said aperture such that the top surface of said circuit board and the top surface of said semiconductor chip are at approximately the same level.

18. The assembly according to claim 15, further including:

conductive wires extending from bond pads on said semiconductor chip positioned within said aperture and being connected to said conductive areas on said circuit board to electrically connect integrated circuits on said semiconductor chip extending through said aperture to said circuit board;

said electrical interconnections forming an electrical circuit connection between said first semiconductor chip and a second semiconductor chip mounted on said circuit board to perform electrical circuit functions using both of said chips without having the electrical signals between chips being provided out of said assembly on said electrical connectors.

19. A modular power circuit assembly comprising:

a metal base plate;

a substantially rigid printed circuit board having metallic areas formed on a surface thereof and an aperture extending through the circuit board, the circuit board being attached to the metal base plate;

a metallic path formed on the printed circuit board and electrically connected to at least two of the metallic areas;

a first semiconductor chip electrically connected to one of the metallic areas of the printed circuit board, the first semiconductor chip being positioned within the aperture, passing through the circuit board, and attached directly to the metal base plate, a second semiconductor chip directly electrically connected and mounted on one of the metallic areas on the printed circuit board;

a plurality of electrical connectors integral with and extending from the printed circuit board, the electrical connectors being metallized parts of the printed circuit board, being electrically connected to a plurality of the metallic paths and being adapted to be connected to electric devices positioned external to the printed circuit board; and a unitary plastic cover extending over the printed circuit board to totally enclose the semiconductor chips, the metallic areas, and the metallic path between the unitary plastic cover and the base plate.

20. The assembly according to claim 19 wherein the entire printed circuit board except for the electrical connectors is totally enclosed between the plastic cover and the base plate, the electrical connectors extending through the plastic cover.

21. The assembly according to claim 14 wherein the printed circuit board is joined to the base plate by posts adapted to provide space between the circuit board and the base plate, and the plastics cover extends in the spaced provided between the circuit board and the base plate by the posts.

22. The assembly according to claim 19, further including:

conductive wires extending from bond pads on the semiconductor chips and being connected to some of the metallic areas on the circuit board to electrically connect integrated circuits on the semiconductor chips to the circuit board; and said metallic path forming an electrical circuit connection between the first semiconductor chip and the second semiconductor chip to perform electrical circuit functions using both of the semiconductor chips without having electrical signals between the semiconductor chips being provided out of the assembly on the terminating connectors.

* * * * *

UNITED STATES PATENT AND TRADEMARK OFFICE
CERTIFICATE OF CORRECTION

PATENT NO. : 5,353,194
DATED : October 4, 1994
INVENTOR(S) : Giuseppe Libretti and Paolo Casati It is certified that error appears in the above-identified patent and that said Letters Patent is hereby corrected as shown below:

In column 6, claim 6, line 48, please delete "clam" and substitute therefor --claim--.

In column 8, claim 18, line 24, after "between" and before "chips", please insert --the--.

In column 8, claim 19, line 42, after "connected" and before "and", please insert --to--.

In column 8, claim 21, line 61, please delete "14" and substitute therefor --19--.

Signed and Sealed this

Twenty-eight Day of February, 1995

Attest:

BRUCE LEHMAN

Attesting Officer      Commissioner of Patents and Trademarks